United States Patent
Park

(10) Patent No.: US 10,502,788 B2
(45) Date of Patent: Dec. 10, 2019

(54) CIRCUIT FOR DRIVING 3-PHASE MOTOR

(71) Applicant: Hyundai Mobis Co., Ltd., Seoul (KR)

(72) Inventor: Jaehyun Park, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 80 days.

(21) Appl. No.: 15/869,382

(22) Filed: Jan. 12, 2018

(65) Prior Publication Data
US 2018/0203068 A1    Jul. 19, 2018

(30) Foreign Application Priority Data

Jan. 18, 2017 (KR) .................... 10-2017-0008917

(51) Int. Cl.
*G01R 31/34*      (2006.01)
*H02P 29/024*    (2016.01)

(52) U.S. Cl.
CPC .......... *G01R 31/34* (2013.01); *H02P 29/0241* (2016.02)

(58) Field of Classification Search
CPC ...... G01R 31/34; G01R 31/42; H02P 29/0241
See application file for complete search history.

(56) References Cited

U.S. PATENT DOCUMENTS

| 8,941,338 B2* | 1/2015 | Villhauer | B41F 33/12 187/288 |
| 2001/0019249 A1* | 9/2001 | Kato | H02M 7/53871 318/400.06 |
| 2004/0090807 A1* | 5/2004 | Youm | H02M 7/219 363/132 |
| 2004/0227479 A1* | 11/2004 | Youm | H02M 7/53875 318/375 |
| 2015/0084560 A1* | 3/2015 | Earanky | H02P 29/0241 318/400.21 |
| 2017/0077859 A1* | 3/2017 | Chretien | H02P 27/06 |
| 2017/0353140 A1* | 12/2017 | Baburajan | B60L 50/51 |

FOREIGN PATENT DOCUMENTS

KR    10-2015-0081183    7/2015

\* cited by examiner

*Primary Examiner* — Dominic E Hawkins
(74) *Attorney, Agent, or Firm* — H.C. Park & Associates, PLC

(57) ABSTRACT

A circuit for driving a 3-phase motor including: an inverter circuit configured to drive a 3-phase motor; a power supply configured to supply an inverter driving voltage and an inverter fault detection voltage to the inverter circuit; and a controller configured to select a voltage supplied by the power supply to the inverter circuit, depending on whether the 3-phase motor is driven. The controller then determines a fault state of the inverter circuit by periodically detecting voltage levels of designated nodes of the inverter circuit.

7 Claims, 2 Drawing Sheets

CIRCUIT FOR DRIVING 3-PHASE MOTOR

CROSS-REFERENCES TO RELATED APPLICATION

This application claims priority from and the benefit of Korean Patent Application No. 10-2017-0008917, filed on Jan. 18, 2017, which is hereby incorporated by reference for all purposes as if set forth herein.

BACKGROUND

Field

Exemplary embodiments relate to a circuit for driving a 3-phase motor. More particularly, exemplary embodiments relate to a circuit for driving a 3-phase motor, which is capable of periodically determining whether a plurality of switch elements in an inverter circuit for driving a 3-phase motor have a fault or are damaged, and periodically monitoring a 3-phase voltage applied to the 3-phase motor.

Discussion of the Background

In general, when a circuit for driving a 3-phase motor applies a 3-phase AC voltage to a stator winding of a 3-phase motor 200 through an inverter circuit 100 as illustrated in FIG. 1, the 3-phase AC voltage generates a rotating field. Then, a current is generated in a rotor conductor while the rotor cuts the magnetic flux.

The inverter circuit 100 is a power conversion device which converts a voltage and frequency supplied to the 3-phase motor 200. The inverter circuit 100 also serves as a velocity control device which varies a voltage and frequency supplied from a commercial power supply according to a load condition, and supplies the varied voltage and frequency to the 3-phase motor 200, in order to control the 3-phase motor 200 to operate at a required velocity.

The inverter circuit 100 includes a plurality of switch elements (for example, FETs), and outputs a voltage and frequency which can satisfy a condition requested by the 3-phase motor 200 through repeated on/off operations of the switch elements.

The inverter circuit 100 has output terminals which are connected to the respective phases of the 3-phase motor 200 in order to supply a voltage.

When the 3-phase motor 200 is shorted because the inverter circuit 100 and the 3-phase motor 200 are connected to each other, the inverter circuit 100 is likely to be damaged. Furthermore, the 3-phase motor 200 may not be normally driven by the short circuit, and an abnormal operation of the 3-phase motor 200 may cause a fault in other elements connected thereto.

The related art is disclosed in Korean Patent Publication No. 10-2015-0081183 published on Jul. 13, 2015 and entitled "Short circuit detector for 3-phase motor".

The above information disclosed in this Background section is only for enhancement of understanding of the background of the invention and, therefore, it may contain information that does not constitute prior art.

SUMMARY

Exemplary embodiments of the present invention provide a circuit for driving a 3-phase motor, which is capable of periodically determining whether a plurality of switch elements in an inverter circuit for driving a 3-phase motor have a fault or damage, and periodically monitoring a 3-phase voltage applied to the 3-phase motor.

Additional features of the invention will be set forth in the description which follows, and in part will be apparent from the description, or may be learned by practice of the invention.

An exemplary embodiment of the present invention discloses a circuit for driving a 3-phase motor, including: an inverter circuit configured to drive a 3-phase motor; a power supply configured to supply an inverter driving voltage and an inverter fault detection voltage to the inverter circuit; and a controller configured to select a voltage supplied by the power supply to the inverter circuit, depending on whether the 3-phase motor is driven, and determine a fault state of the inverter circuit by periodically detecting voltage levels of designated nodes of the inverter circuit.

The controller may detect: a voltage level of a node N1 through which first terminals U1, V1, and W1 of high-level switch elements F1, F3 and F5 of the inverter circuit are commonly connected to an output terminal of the power supply; and voltage levels of nodes N2 to N4 to which second terminals of the high-level switch elements F1, F3 and F5 and first terminals of low-level switch elements F2, F4 and F6 are commonly connected, respectively, wherein the second terminals of the high-level switch elements F1, F3 and F5 and the first terminals of the low-level switch elements F2, F4 and F6 are connected to the respective phases of the 3-phase motor.

The inverter circuit may include three high-level switch elements and three low-level switch elements which are connected in series to each other, respectively.

The first terminals U1, V1 and W1 of the high-level switch elements F1, F3 and F5 may be connected to the output terminal of the power supply, the second terminals of the high-level switch elements F1, F3 and F5 may be connected to the respective phases of the 3-phase motor, the first terminals of the low-level switch elements F2, F4 and F6 may be connected to the respective phases of the 3-phase motor, the second terminals of the low-level switch elements F2, F4 and F6 may be grounded, and resistors R1 to R6 may be connected in parallel to the respective switch elements F1 to F6.

The resistors may be configured in such a manner that the sums of values of resistor pairs (R1, R2), (R3, R4) and (R5, R6) each connected to each other are different from each other.

The power supply may include: a first power supply configured to supply the inverter driving voltage to the inverter circuit through switching of first and second FETs; and a second power supply configured to supply the inverter fault detection voltage to the inverter circuit through switching of first and second transistors.

The inverter driving voltage may be supplied for the inverter circuit to drive the 3-phase motor, and the inverter fault detection voltage may be supplied to periodically determine whether each of the switch elements of the inverter circuit has a fault or damage, when the 3-phase motor is not driven.

The controller may apply the inverter driving voltage to the inverter circuit when the 3-phase motor is driven, and apply the inverter fault detection voltage to the inverter circuit when the 3-phase motor is not driven.

The controller may detect voltages at the designated nodes of the circuit for driving the 3-phase motor, compare the detected voltages to voltages stored in a lookup table, and determine states of the respective switch elements F1 to F6 in the inverter circuit depending on the detected voltages.

The voltages detected at the designated nodes N1 to N4 for the voltages applied to the respective switch elements F1 to F6 of the inverter circuit, depending on a normal state or fault state, are stored in the form of a lookup table in advance.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
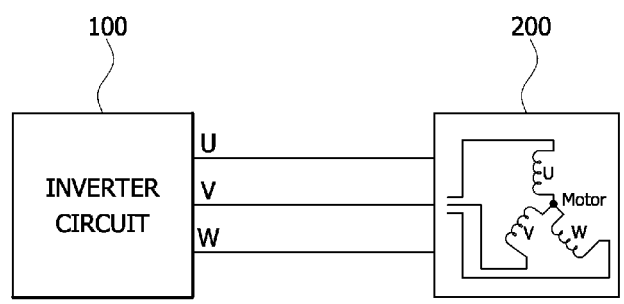
FIG. 1 illustrates a connection configuration between an inverter circuit and a 3-phase motor according to the related art.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. Like reference numerals in the drawings denote like elements.

Various advantages and features of the present invention and methods accomplishing thereof will become apparent from the following description of embodiments with reference to the accompanying drawings. However, the present invention is not be limited to the embodiments set forth herein but may be implemented in many different forms. The present embodiments may be provided so that the disclosure of the present invention will be complete, and will fully convey the scope of the invention to those skilled in the art and therefore the present invention will be defined within the scope of claims. Like reference numerals throughout the description denote like elements.

Unless defined otherwise, it is to be understood that all the terms (including technical and scientific terms) used in the specification has the same meaning as those that are understood by those who skilled in the art. Further, the terms defined by the dictionary generally used should not be ideally or excessively formally defined unless clearly defined specifically. It will be understood that for purposes of this disclosure, "at least one of X, Y, and Z" can be construed as X only, Y only, Z only, or any combination of two or more items X, Y, and Z (e.g., XYZ, XYY, YZ, ZZ). Unless particularly described to the contrary, the term "comprise", "configure", "have", or the like, which are described herein, will be understood to imply the inclusion of the stated components, and therefore should be construed as including other components, and not the exclusion of any other elements.

Embodiments of the invention will hereinafter be described in detail with reference to the accompanying drawings. It should be noted that the drawings are not to precise scale and may be exaggerated in thickness of lines or sizes of components for descriptive convenience and clarity only. Furthermore, the terms as used herein are defined by taking functions of the invention into account and can be changed according to the custom or intention of users or operators. Therefore, definition of the terms should be made according to the overall disclosures set forth herein.

Figure 2:
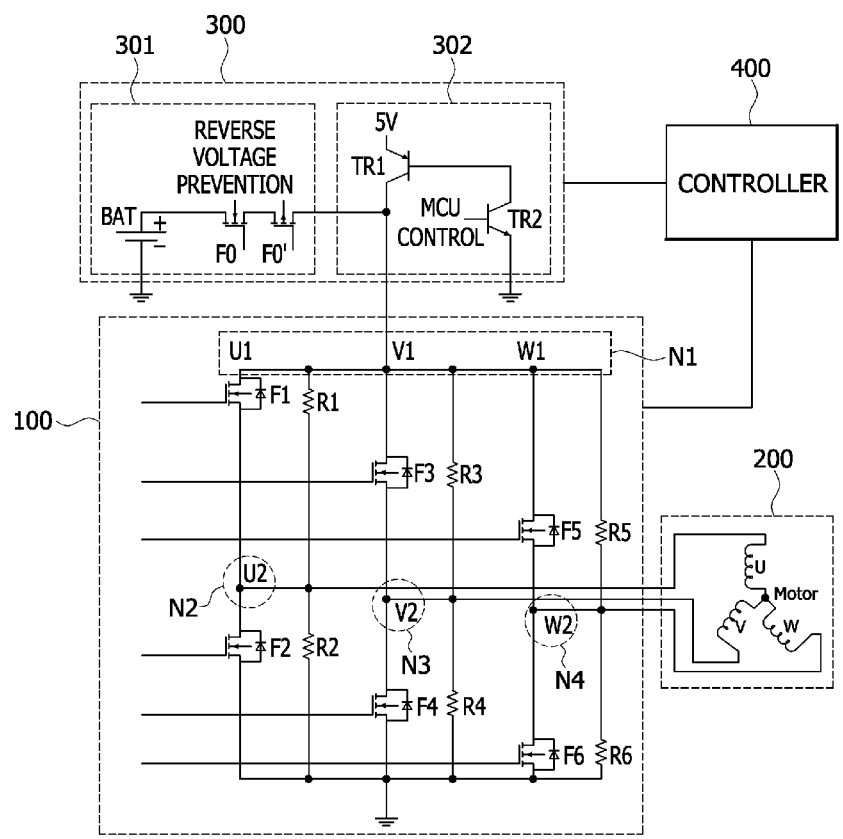
FIG. 2 illustrates a schematic configuration of a circuit for driving a 3-phase motor in accordance with an exemplary embodiment of the present invention.

FIG. 2 illustrates a schematic configuration of a circuit for driving a 3-phase motor in accordance with an embodiment of the present embodiment.

As illustrated in FIG. 2, the circuit for driving a 3-phase motor in accordance with the present embodiment may include an inverter circuit 100, a 3-phase motor 200, a power supply 300 and a controller 400.

The inverter circuit 100 may include a plurality of switch elements F1 to F6 to supply a 3-phase voltage for an operation of the 3-phase motor 200.

The plurality of switch elements F1 to F6 of the inverter circuit 100 may be switched to apply a driving voltage to the 3-phase motor 200.

For example, the plurality of switch elements F1 to F6 may include a FET (Field Effect Transistor), BJT (Bipolar Junction Transistor), SCR (Silicon-Controlled Rectifier), GTO (Gate-Turn-Off) thyristor and IGBT (Insulated Gate Bipolar Transistor).

The switch elements F1 to F6 of the inverter circuit 100 may be divided into three high-level switch elements F1, F3 and F5 and three low-level switch elements F2, F4 and F6, which are connected in series to each other, respectively.

One terminals U1, V1 and W1 of the high-level switch elements F1, F3 and F5 may be connected to an output terminal of the power supply 300 for supplying a driving voltage, and the other terminals thereof may be connected to the respective phases of the 3-phase motor 200. One terminals U2, V2 and W2 of the low-level switch elements F2, F4 and F6 may be connected to the respective phases of the 3-phase motor 200, and the other terminals thereof may be grounded.

The output terminal of the inverter circuit 100 may indicate the other terminals of the high-level switch elements F1, F3 and F5 and the one terminals of the low-level switch elements F2, F4 and F6, which are connected to the respective phases of the 3-phase motor 200.

Since the connection configuration of the switch elements F1 to F6 is generally applied in the inverter circuit 100, the detailed descriptions thereof are omitted herein.

The controller (MCU) 400 may detect the voltage levels of nodes N1 to N4. The one terminals U1, V1 and W1 of the high-level switch elements F1, F3 and F5 may be commonly connected to the output terminal of the power supply 300 through the node N1, and the other terminals of the high-level switch elements F1, F3 and F5 and the one terminals of the low-level switch elements F2, F4 and F6, which are connected to the respective phases of the 3-phase motor 200, may be commonly connected to the nodes N2 to N4, respectively.

In the present embodiment, the switch elements F1 to F6 of the inverter circuit 100 may be connected in parallel to resistors R1 to R6, respectively.

Since the switch elements F1 and F2 are connected in series to each other, the resistors R1 and R2 connected in parallel to the switch elements F1 and F2, respectively, may be connected in series to each other. Similarly, the resistors R3 and F4 connected in parallel to the switch elements F3 and F4, respectively, may be connected in series to each other, and the resistors R5 and R6 connected in parallel to the switch elements F5 and F6, respectively, may be connected in series to each other.

At this time, the values of the respective resistors R1 to R6 may be set in such a manner that the sums of the values of the resistor pairs (R1, R2), (R3, R4) and (R5 and R6) each connected in series are different from each other.

For example, when the first resistor R1 is set to 10KΩ, the second resistor R2 is set to 10KΩ, the third resistor R3 is set to 20KΩ, the fourth resistor R4 is set to 10KΩ, the fifth resistor R5 is set to 30KΩ, and the sixth resistor R6 is set to 10KΩ, the first serial resistors R1 and R2 may have a value of 20KΩ, the second serial resistors R3 and R4 may have a value of 30KΩ, and the third serial resistors R5 and R6 may have a value of 40KΩ, which means that the values of the serial resistors are different from each other.

However, the resistor values are only an example. In another embodiment, different resistor values may be applied.

The power supply 300 may include a first power supply 301 for supplying an inverter driving voltage (for example, BAT voltage) through switching of first and second FETs F0 and F0' and a second power supply 302 for supplying an inverter fault detection voltage (for example, 5V) through switching of first and second transistors TR1 and TR2.

The first power supply 301 may supply a battery voltage to the inverter circuit 100 through the first and second FETs F0 and F0' connected in series to each other, and the second power supply 302 may supply a voltage (for example, 5V) to the inverter circuit 100, the voltage being set by the first and second transistors TR1 and TR2 connected in series to each other.

For example, the inverter driving voltage of 12.5V or the inverter fault detection voltage of 5V may be supplied to the inverter circuit 100 through the node N1.

The inverter driving voltage (BAT voltage) may be supplied to the inverter circuit 100 to drive the 3-phase motor 200, and the inverter fault detection voltage (for example, 5V) may be supplied to determine whether each of the switch elements F1 to F6 of the inverter circuit 100 has a fault or damage, when the 3-phase motor 200 is not driven.

At this time, the inverter fault detection voltage may be supplied through the switching of the first and second transistors TR1 and TR2, and the inverter driving voltage may be supplied by the switching of the first and second FETs F0 and F0'. The inverter fault detection voltage may be supplied when the inverter driving voltage is not supplied, for example, when the 3-phase motor is not driven.

Therefore, the controller 400 may periodically monitor a voltage (for example, inverter fault detection voltage) divided by the resistors R1 to R6, even when the 3-phase motor 200 is not driven, and determine whether the switch elements F1 to F5 has a fault or damage (for example, short circuit).

For example, when the first switch element F1 has a fault (for example, short circuit), the first node N1 may have the same voltage value as the second node N2, and when the second switch element F2 has a fault (for example, short circuit), the second node N2 may have the ground level GND. Furthermore, when the first switch element F1 has a fault (for example, disconnection), the voltage level of the second node N2 may be lower than in a normal state, and when the second switch element F2 has a fault (for example, disconnection), the voltage level of the second node N2 may be lower than the voltage level of the first node N1 in a normal state, and higher than the voltage level of the second node N2 in a normal state.

Similarly, the controller 400 may detect the voltage levels of the first and third nodes N1 and N3 to determine whether the switch elements F3 and F4 have a fault (for example, short circuit or disconnection), and detect the voltage levels of the first and fourth nodes N2 and N4 to determine whether the switch elements F5 and F6 have a fault.

The controller 400 may store voltages in the form of a lookup table, the voltages being detected through the respective nodes N1 to N4 for the voltages applied to the switch elements F1 to F6 (for example, the inverter driving voltage and the inverter fault detection voltage), depending on each state (for example, the normal state or fault state).

Furthermore, the controller 400 may always determine whether the switch elements F1 to F6 of the inverter circuit 100 have a fault, by referring to the lookup table.

For example, the 3-phase motor driving circuit in accordance with the present embodiment may apply the inverter driving voltage (for example, BAT voltage) to the inverter circuit 100 when driving the 3-phase motor, and apply the inverter fault detection voltage (for example, 5V) to the inverter circuit 100 when not driving the 3-phase motor.

Therefore, the controller 400 may detect voltages at the respective designated nodes N1 to N4 of the 3-phase motor driving circuit, compare the detected voltages to the voltages stored in the lookup table, and always determine a state depending on the detected voltages (for example, the normal state or fault state).

In accordance with the embodiment of the present invention, the circuit for driving a 3-phase motor may periodically determine whether the plurality of switch elements in the inverter circuit for driving the 3-phase motor have a fault or damage, and periodically monitor the 3-phase voltage applied to the 3-phase motor Although preferred embodiments of the invention have been disclosed for illustrative purposes, those skilled in the art will appreciate that various modifications, additions and substitutions are possible, without departing from the scope and spirit of the invention as defined in the accompanying claims.

What is claimed is:
1. A circuit for driving a 3-phase motor, comprising:
an inverter circuit configured to drive a 3-phase motor;
a power supply configured to supply an inverter driving voltage and an inverter fault detection voltage to the inverter circuit; and
a controller configured to select a voltage supplied by the power supply to the inverter circuit, depending on whether the 3-phase motor is driven,
wherein:
the controller is configured to determine a fault state of the inverter circuit by periodically detecting voltage levels of a plurality of designated nodes of the inverter circuit;
the controller is configured to:
apply the inverter driving voltage to the inverter circuit when the 3-phase motor is driven; and
apply the inverter fault detection voltage to the inverter circuit when the 3-phase motor is not driven;
detect voltages at the designated nodes of the inverter circuit for driving the 3-phase motor;
compare the detected voltages to voltages stored in a lookup table; and
determine states of the respective switch elements in the inverter circuit
depending on the detected voltages; and
the voltages detected at the designated nodes for the voltages applied to the respective switch elements of the inverter circuit, depending on a normal state or fault state, are stored in the form of a lookup table in advance.

2. The circuit of claim 1, wherein the controller is configured to detect:
   a voltage level of a node through which first terminals of high-level switch elements of the inverter circuit are commonly connected to an output terminal of the power supply; and
   voltage levels of nodes to which second terminals of the high-level switch elements and first terminals of low-level switch elements are commonly connected, respectively,
   wherein the second terminals of the high-level switch elements and the first terminals of the low-level switch elements are connected to the respective phases of the 3-phase motor.

3. The circuit of claim 2, wherein the inverter circuit comprises three high-level switch elements and three low-level switch elements which are connected in series to each other, respectively.

4. The circuit of claim 3, wherein the first terminals of the high-level switch elements are connected to the output terminal of the power supply, the second terminals of the high-level switch elements are connected to the respective phases of the 3-phase motor, the first terminals of the low-level switch elements are connected to the respective phases of the 3-phase motor, the second terminals of the low-level switch elements are grounded, and resistors are connected in parallel with the respective switch elements.

5. The circuit of claim 4, wherein the resistors are configured in such a manner that the sums of values of resistor pairs each connected to each other are different from each other.

6. The circuit of claim 1, wherein the power supply comprises:
   a first power supply configured to supply the inverter driving voltage to the inverter circuit through switching of first and second FETs; and
   a second power supply configured to supply the inverter fault detection voltage to the inverter circuit through switching of first and second transistors.

7. The circuit of claim 6, wherein:
   the inverter driving voltage is supplied for the inverter circuit to drive the 3-phase motor; and
   the inverter fault detection voltage is supplied to periodically determine whether each of the switch elements of the inverter circuit has a fault or damage, when the 3-phase motor is not driven.

\* \* \* \* \*